United States Patent
Padullaparthi

(10) Patent No.: US 9,484,495 B2
(45) Date of Patent: Nov. 1, 2016

(54) SEMICONDUCTOR LIGHT-EMITTING ELEMENT AND METHOD FOR MANUFACTURING THE SAME

(71) Applicant: SAE Magnetics (H.K.) Ltd., Hong Kong (CN)

(72) Inventor: Babu Dayal Padullaparthi, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 0 days.

(21) Appl. No.: 14/319,251

(22) Filed: Jun. 30, 2014

(65) Prior Publication Data
US 2015/0380606 A1    Dec. 31, 2015

(51) Int. Cl.
*H01L 33/20* (2010.01)
*H01S 5/00* (2006.01)
*H01L 33/38* (2010.01)
*H01L 33/44* (2010.01)

(52) U.S. Cl.
CPC .......... *H01L 33/20* (2013.01); *H01S 5/00* (2013.01); *H01L 33/38* (2013.01); *H01L 33/44* (2013.01); *H01L 2933/0025* (2013.01)

(58) Field of Classification Search
None
See application file for complete search history.

(56) References Cited

U.S. PATENT DOCUMENTS

| | | | |
|---|---|---|---|
| 6,268,276 B1* | 7/2001 | Chan | H01L 21/7682 257/E21.581 |
| 7,974,327 B2* | 7/2011 | Ariga | H01S 5/0422 372/38.05 |
| 2006/0056473 A1* | 3/2006 | Tanigawa | H01S 5/18347 372/43.01 |
| 2009/0115061 A1* | 5/2009 | Chen | H01L 21/76807 257/751 |
| 2010/0181651 A1* | 7/2010 | Pan | H01L 31/02161 257/623 |

FOREIGN PATENT DOCUMENTS

| | | |
|---|---|---|
| JP | 2007-165393 | 6/2007 |
| JP | 2013-197238 | 9/2013 |

OTHER PUBLICATIONS

Al-Omair et al., "Polyimide-Planarized Vertical-Cavity Surface-Emitting Lasers With 17.0-GHz Bandwidth", IEEE Photonics Technology Letters, vol. 16, No. 4, Apr. 2004, 3 pages.

* cited by examiner

*Primary Examiner* — Matthew Reames
*Assistant Examiner* — Steven B Gauthier
(74) *Attorney, Agent, or Firm* — Nixon & Vanderhye PC

(57) ABSTRACT

A semiconductor light-emitting element includes: a double-mesa structure of semiconductor formed to have a cylindrical cross section; an insulating member formed to fill a space surrounding the double-mesa structure, with the insulating member comprising a lower insulating member and an upper insulting member covering the lower insulating member; and a first electrode formed on the upper insulating member to come into contact with part of a top surface of the double-mesa structure. The lower insulating member has multiple lower air pillars that are formed in an area aligning with the first electrode, and the upper insulating member has multiple upper air pillars that are formed around the first electrode. It has low dielectric constant and reduced electrical parasitics especially parasitic capacitances, thereby improving high frequency performance and improving modulation speed of light-emitting device finally.

6 Claims, 9 Drawing Sheets

SEMICONDUCTOR LIGHT-EMITTING ELEMENT AND METHOD FOR MANUFACTURING THE SAME

FIELD OF THE INVENTION

The present invention relates to semiconductor light-emitting elements applicable to surface emitting semiconductor laser elements or the like, and methods for manufacturing such an element.

BACKGROUND OF THE INVENTION

In recent years, rapid increase of the Internet has pushed the amount of data transmission sharply, so that high-speed data communications networks have required.

Surface emitting laser elements (or vertical cavity surface emitting laser elements (VCSELs)) are characterized in that laser light can be emitted in a perpendicular direction to the principal surface of a substrate formed with the element and in that the element has low threshold current and high power conversion efficiency. In addition to this, the surface emitting laser elements have various advantages that: they can emit circular light whose cross section perpendicular to the optical axis is circular; two-dimensional arrangement of them is facilitated; and on-wafer inspection of them is carried out easily; other advantages. Moreover, the surface emitting laser elements are expected to be fabricated at low cost. Thus, in the future, the surface emitting laser elements are expected to obtain more increasing demand as light sources for high-speed data communications.

In order to use a surface emitting laser element for a light source for data communications, it is important for the element to have a structure capable of operating at high speed. In order for the surface emitting laser element to accomplish a high-speed operation above 10 Gbit/s in the future, it is especially important to reduce the electrical parasitics such as impedances and capacitance of the light emitting element.

As the electro-optical performance of light-emitting elements continues to be incrementally refined (fine tuned or optimized), electrical parasitic capacitances in these small devices have becoming the critical for the high-speed of operation. As the device speeds increase, electrical parasitics limit the performance of high-speed, the device impedance and pad capacitances are increasingly becomes design factors. This is especially true for all semiconductor electro-optical devices. As the optical qualities continue to be incrementally refined, parasitic capacitances in these already small devices become the criticality in the speed of operation.

For the reasons mentioned above, it is desirable to provide a semiconductor light-emitting element which reduces the parasitic capacitance and therefore improves high frequency performance and modulation speed of light-emitting devices.

SUMMARY OF THE INVENTION

One objective of the present invention is to provide a semiconductor light-emitting element, which has low dielectric constant and reduced electrical parasitics especially parasitic capacitances, thereby improving high frequency performance and improving modulation speed of light-emitting device finally.

Another objective of the present invention is to provide a method for manufacturing a semiconductor light-emitting element, which has reduced electrical parasitics especially parasitic capacitances and low dielectric constant, thereby improving high frequency performance and improving modulation speed of light-emitting devices finally.

To achieve above objectives, a semiconductor light-emitting element includes:

a double-mesa structure of semiconductor formed to have a cylindrical cross section;

an insulating member formed to fill a space surrounding the double-mesa structure, with the insulating member comprising a lower insulating member and an upper insulting member covering the lower insulating member; and a first electrode formed on the upper insulating member to come into contact with part of a top surface of the double-mesa structure;

and the lower insulating member has multiple lower air pillars in the form of a matrix that are formed in an area aligning with the first electrode, and the upper insulating member has multiple upper air pillars surrounding the first electrode.

Preferably, the lower air pillars in the lower insulating member are not connected with the upper air pillars in the upper insulating member under the first electrode area.

Preferably, it further includes a second electrode formed on the upper insulating member, wherein a gap is formed on the upper insulating member, and/or formed on the lower insulting member, which is between the first electrode and the second electrode.

Preferably, the lower insulating member is made of benzocyclobutene resin, polyimide resin, AL polymer, SU8 photoresist, or coating resin of Sumiresin Excel.

Preferably, the upper insulating member is made of benzocyclobutene resin, polyimide resin, polyimide resin, AL polymer, SU8 photoresist, coating resin of Sumiresin Excel, thick layers of silicon oxide, silicon nitride, silicon oxynitride, niobium oxide, zirconium oxide, or tantalum oxide.

Preferably, the lower air pillars are formed in areas that are aligned with both of the first electrode and the second electrode.

Accordingly, a method for manufacturing a semiconductor light-emitting element includes:

forming a semiconductor multilayer film on a substrate;

selectively etching the semiconductor multilayer film to form the semiconductor multilayer film into a double-mesa structure with a cylindrical cross section;

forming a lower insulating member on an outer surface of the double-mesa structure and its surrounding portion, with the lower insulating member having multiple lower air pillars in the form of a matrix formed therein;

forming an upper insulating member on the lower insulating member to cover a top of the lower insulating member; and forming a first electrode on the upper insulating member to come into contact with part of a top surface of the double-mesa structure, with the upper insulating member having multiple upper air pillars formed surrounding the first electrode area.

Preferably, the lower air pillars in the lower insulating member are not connected with the upper air pillars in the upper insulating member.

Preferably, the lower air pillars and the upper air pillars are formed by Reactive Ion Etching or wet etching.

Preferably, the method further includes:

forming a second electrode on the upper insulating member; and forming a gap on the upper insulating member, and/or on the lower insulting member, with the gap being between the first electrode and the second electrode.

Preferably, the lower insulating member is made of benzocyclobutene resin, polyimide resin, AL polymer, SU8 photoresist, or coating resin of Sumiresin Excel.

Preferably, the upper insulating member is made of benzocyclobutene resin, polyimide resin, polyimide resin, AL polymer, SU8 photoresist, coating resin of Sumiresin Excel, thick layers of silicon oxide, silicon nitride, silicon oxynitride, niobium oxide, zirconium oxide, or tantalum oxide.

Preferably, the lower air pillars are formed in areas that are aligned with both of the first electrode and the second electrode.

In comparison with the prior art, as the semiconductor light-emitting element of the present invention configures the lower air pillars and the upper air pillars in the lower and upper insulating members respectively, thus the dielectric constant of the combined (first and second) insulating members is reduced effectively due to the small fill factor of insulating material (large fill factor of air pillar) therein, and the electrical parasitics especially parasitic capacitance is decreased accordingly, which improves high frequency performance and modulation speed of optoelectronic devices finally. In addition, the dielectric constant of the insulating member can be tunable and controllable by optimizing the fill factor of air pillars by changing size, shape, amount thereof for example.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1A:
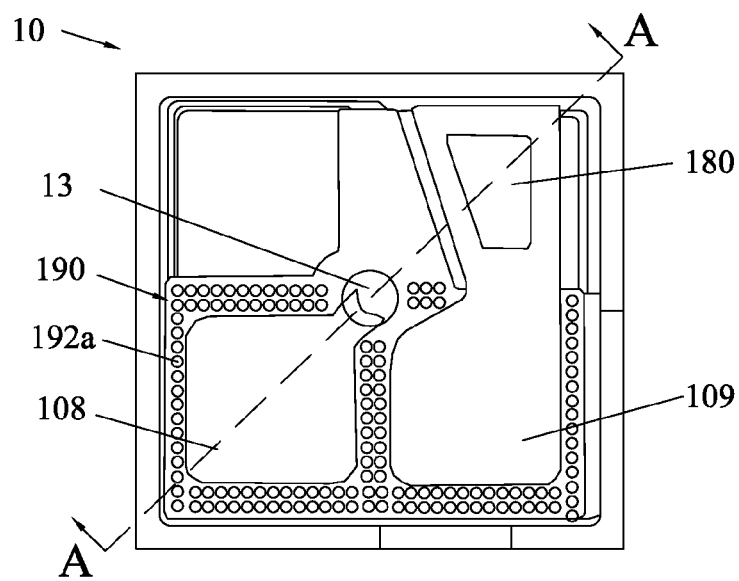
FIG. 1A is a plane view of a semiconductor light-emitting element according to an embodiment of the invention.

Various preferred embodiments of the invention will now be described with reference to the figures, wherein like reference numerals designate similar parts throughout the various views. As indicated above, the invention is directed to a semiconductor light-emitting element and a manufacturing method thereof, which has low dielectric constant and reduced electrical parasitics especially parasitic capacitances, thereby improving high frequency performance and improving modulation speed of light-emitting device finally.

Figure 1B:
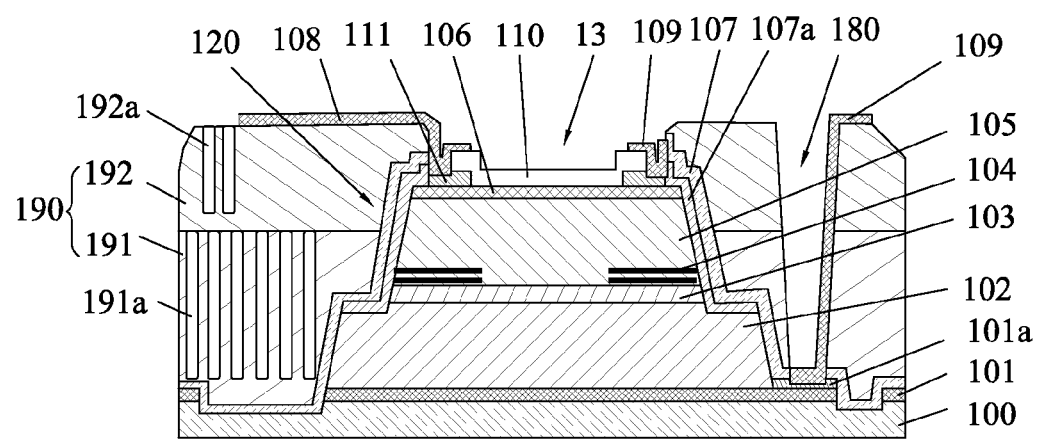
FIG. 1B is a cross-sectional view of the semiconductor light-emitting element shown in FIG. 1A along A-A line.

Referring to FIGS. 1A and 1B, a semiconductor lighting-emitting element 10 according to one embodiment of the present invention includes a substrate 100, and multilayer structure formed on the substrate 100, which includes a lower n-type contact layer 101, a lower reflecting mirror film 102 made of an n-type semiconductor multilayer film, an active layer 103, a current confinement layer 104, an upper reflecting mirror film 105 made of a p-type semiconductor multilayer film, and an upper p-type contact layer 106.

Concretely, the substrate 100 may be n-type, p-type or un-doped GaAs substrate. In the present embodiment, the substrate 100 is an un-doped GaAs which has a thickness of ≈150 μm. The films and layers mentioned above are sequentially formed by epitaxial crystal growth in the listed order form bottom to top.

Concretely, the lower reflecting mirror film 102 can be n-type reflector or p-type reflector, and the upper reflecting mirror film 105 has the opposite polarity. In the present embodiment, the lower reflecting mirror film 102 is an n-type reflector and upper reflecting mirror film 105 is a p-type reflector. Generally, the lower and upper reflecting mirror films 102, 105 respectively are stacks of layers in different refractive index layers alternately stacked, which are made with materials such as AlAs, GaAs, or AlGaAs having different mole fractions of Aluminum and Gallium. In actual implementations, each of reflecting mirror films 102 or 105 may include many layers such as twenty or thirty pairs of layers, or more.

The active layer 103 is typically constructed from one or more quantum wells of InGaAs, GaAs, AlGaAs, InAlGaAs, or InGaNAsP. The active layer 103 is configured to generate light having a predetermined emission wavelength. The predetermined emission wavelengths used for optical communication include 780 nm, 850 nm, 980 nm, 1060 nm, 1310 nm, 1550 nm, and particularly, emission wavelengths 850 nm and 1060 nm are preferably used for VCSEL device 10 of the present invention.

The lower reflecting mirror film 102, the active layer 103, the current confinement layer 104, the upper reflecting mirror film 105, and the upper p-type contact layer 106 are etched in mesa shape to expose the lower reflecting mirror film 102, and thus the etched layers and films constitute a double-mesa structure 120.

On a side surface of the double-mesa structure 120 and a region of the lower reflecting mirror film 102 exposed beside the double-mesa structure 120, an insulator 107 which is made of silicon oxynitride and a thickness of 500 µm is formed. In this embodiment, the insulator 107 is extended to cover the perimeter of the upper contact layer 106.

On the insulator 107, an insulating member 190 is formed to fill a space surrounding the double-mesa structure 120 with no gap created and to have a higher level than the top surface of the double-mesa structure 120.

On the insulating member 190, a first electrode 108 and a second electrode 109 are formed, therein the first electrode 108 is formed to come into contact with the upper contact layer 106 via a contact metal pad 111 and the insulator 107 at the perimeter thereof; and the second electrode 109 is formed to come into contact with the lower contact layer 101, respectively. The two electrodes 108, 109 form an electrode opening exposing the upper the contact layer 106 (or a protection layer 110 thereon, preferably). Concretely, the first electrode 108 is formed to cover the top end and its vicinity of the double-mesa structure 120 and one corner of the insulating member 190.

Preferably, a protection layer 110 which is insulating may be covered on the upper contact layer 106. In this condition, the electrode opening is formed to expose the protection layer 110.

Specifically, the second electrode 109 is formed to cover the other corner of the insulting member 190, For coming into contact with the lower contact layer 101, a deep groove 180 is formed from top to bottom in a side of the insulating member 190, and the second electrode 109 is covered on both the side wall and bottom side of the deep groove 180.

When a drive current is applied to the first and second electrodes 108, 109, it flows through the active layer 103, and then laser light is generated in the active layer 103. The laser light is amplified while it is reflected back and forth at each interface between layers of lower and upper reflecting mirror films 102, 105, and is emitted from the top window 13 of the light-emitting element 10 vertically.

Figure 2A:
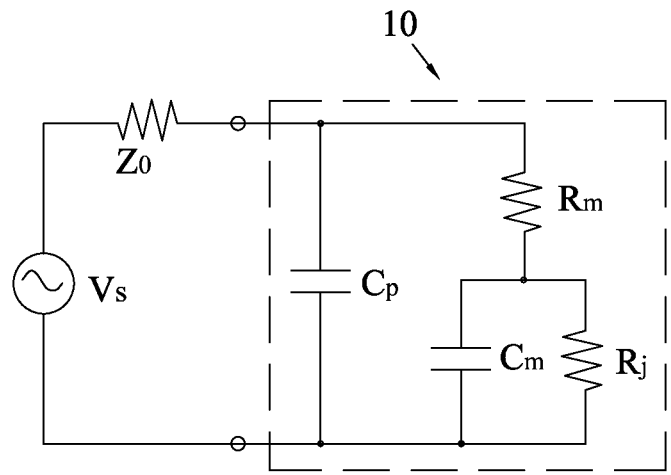
FIG. 2A is a simple equivalent circuit of the components in the semiconductor light-emitting element shown in FIG. 1B.
Figure 2B:
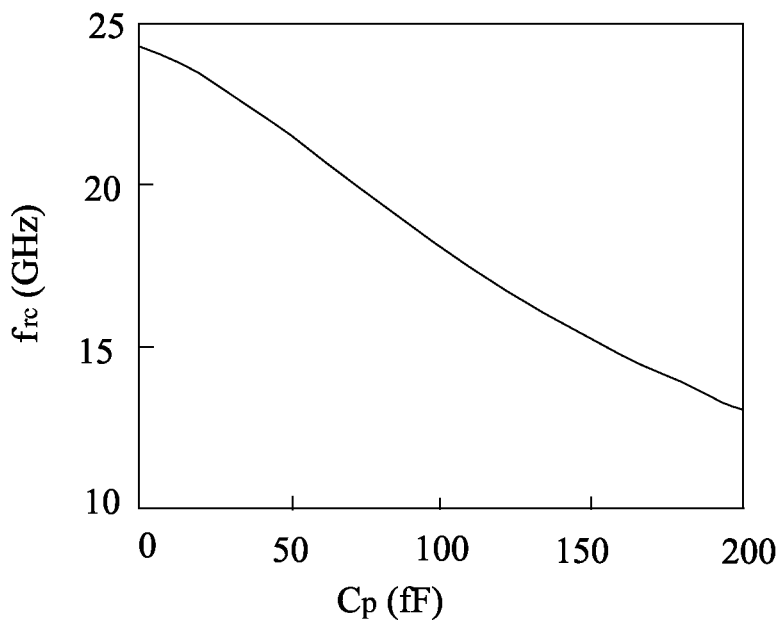
FIG. 2B shows an effect of reducing the capacitance of insulating member of the semiconductor light-emitting element of FIG. 1B.

FIG. 2A shows a simple equivalent circuit of the components in the semiconductor light-emitting element shown in FIG. 1B. Therein, $C_p$ refers to capacitance of the insulating member 190 that is between the first electrode 108 and the second electrode 109, $R_m$ and $R_j$ refer to impedances of the double-mesa 120 that includes the lower and the upper reflecting mirrors (102, 105), and p-n junction formed between p-doped reflecting mirrors and n-doped reflecting mirrors (102,105) and un-doped light emitting region 103 (active layer), respectively, and $C_m$ refers to capacitance of the double-mesa region 120. The relaxation oscillation (ro) frequency of the semiconductor lighting-emitting element depends on the total impedance mentioned above, and could be estimated by formula:

$$f_{ro} \approx \frac{1}{2\pi RC};$$

therein $C=C_p+C_m$ and $R=R_m$. FIG. 2B is a graph that shows relationship between the ro frequency and the capacitance $C_p$.

With the contemplation of the present invention, structure improvement of the insulating member 190 is described now in details. This insulating member 190 is aiming at reducing the capacitance between the first electrode 108 and the second electrode 109, namely the value of Cp mentioned above, in order to improve output ro frequency of the light-emitting element finally. In this present invention, the insulating member 190 is a two-layer structure with air pillar array.

Figure 3:
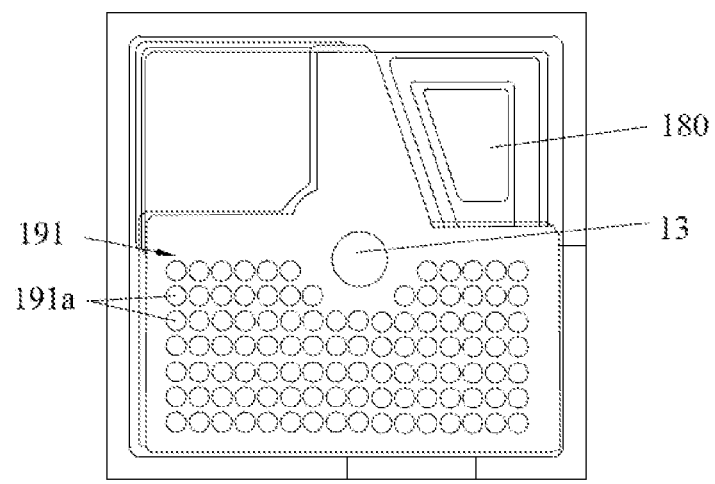
FIG. 3 shows a plane view of lower insulating member of the semiconductor light-emitting element of FIG. 1B.

Referring to FIG. 1B, the insulating member 190 surrounding the double-mesa structure 120 includes a lower insulating member 191 which is made of benzocyclobutene (BCB) resin, polyimide resin, AL polymer, SU8 photoresist, or coating resin of Sumiresin Excel, and an upper insulating member 192 which is made of either benzocyclobutene resin, polyimide resin, AL polymer, SU8 photoresist, coating resin of Sumiresin Excel, thick layers of silicon oxide, silicon nitride, silicon oxynitride, niobium oxide, zirconium oxide, or tantalum oxide covering the lower insulating member 191. As shown in FIGS. 1B and 3, multiple lower air pillars 191a are formed within the lower insulating member 191, which are formed in a position aligning with the first electrode 108 at least, preferably in a position aligning with the first electrode 108 and the second electrode 109. In the embodiment, the lower air pillars 191a are shaped as columnar holes which are arranged in arrays in a matrix form.

Optionally, size, amount and density of the lower air pillars 191a are controllable according to the actual demands. In theory, the capacitance of the insulating member 190 will be less if the amount and the size of the lower air pillars 191a are larger. But for stabilizing the structure, the fill factor of the air pillars 191a is controlled in intermediate and moderate amounts.

One more option for stabilizing the structure is that, the roots (bottoms) of the lower air pillars 191a are controlled not to extend to the bottom of the lower insulating member 191, but with a small distance apart.

As shown in FIGS. 1A and 1B, matrix of upper air pillars 192a are formed on the upper insulating member 192, from top to bottom. Specifically, the upper air pillars 192a run through the top of the upper insulating member 192, and extend downwards to close to, but not run through the bottom thereof. Based on this configuration, the lower air pillars 191a in the lower insulating member 191 are not connected with the upper air pillars 192a in the upper insulating member 192, namely, they are not overlapped with each other, which prevent instability.

More concretely, the upper air pillars 192a are formed surrounding the first electrode 108, but not in a position aligning with the first electrode 108. The reasons for this configuration are that, the first electrode 108 may be recessed when endured electric current to generate high temperature, which may damage the stability of the upper insulating member 192 with air pillars 192a.

In a preferable embodiment, the upper air pillars 192a can be also formed around the second electrode 109, but not aligned with the position of the second electrode 109, as shown in FIG. 1A.

Preferably, a total thickness of the insulating member 190 is about 8~12 µm, the depth of the lower air pillars 191a is about 5~7 µm, and the depth of the upper lower air pillars 192a is about 3~5 µm. But other depth ranges also can be applied, depending on the actual demands.

Like mentioned above, the upper air pillars 192a are formed to further reduce the capacitance of the insulating member 190, based on the lower air pillars 191a. In this upper insulating member 192, the fill factor of the upper air pillars 192a is also controllable, the larger fill factor may bring the less capacitance, and the reduced dielectric constant accordingly. Table 1 shows several examples with different fill factors of air pillar, and the dielectric constants of the lower insulating member 191 (BCB), and the upper insulating member 192 (Polyimide) accordingly.

TABLE 1

| Fill factor of air pillar (%) | Dielectric constant of BCB | Dielectric constant of polyimide |
| --- | --- | --- |
| 75 | 1.4 | 1.55 |
| 50 | 1.8 | 2.1 |
| 25 | 2.2 | 2.65 |
| 0 | 2.6 | 3.2 |

By this token, the dielectric constant of the insulating member 190 becomes smaller when the fill factor of air pillar become lager. In practice, the fill factor of the air pillars 191a, 192a can be controlled in an intermediate and moderate amount, for example.

In comparison with the prior art, as the semiconductor light-emitting element of the present invention configures the lower air pillars 191a and the upper air pillars 192a in the lower and upper insulating members 191, 192 respectively, thus the dielectric constant of the insulating member 190 is reduced effectively due to the small fill factor of insulating material (large fill factor of air pillar) therein, and the electrical parasitics especially parasitic capacitance is decreased accordingly, which improves high frequency performance and modulation speed of optoelectronic devices finally. In addition, the dielectric constant of the insulating member can be tunable and controllable by optimizing the fill factor of air pillars by changing size, shape, amount thereof for example.

Figure 4A:
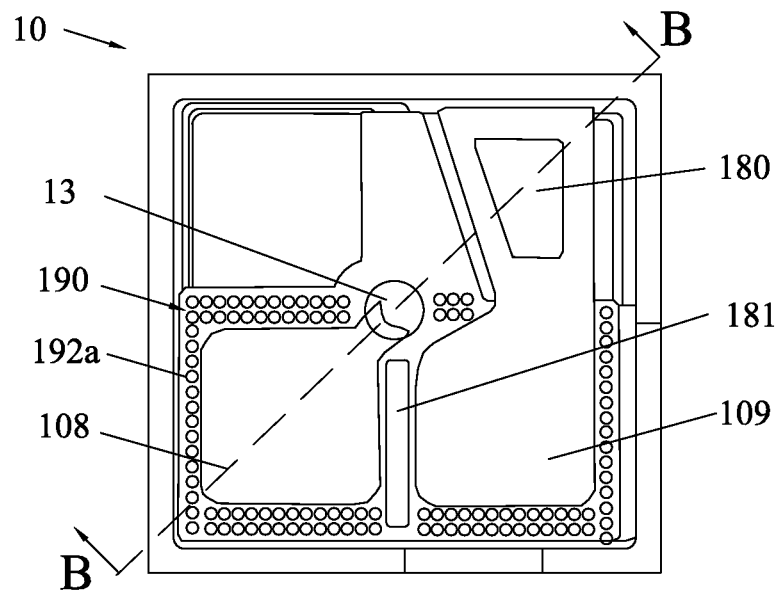
FIG. 4A is a plane view of a semiconductor light-emitting element according to another embodiment of the invention.
Figure 4B:
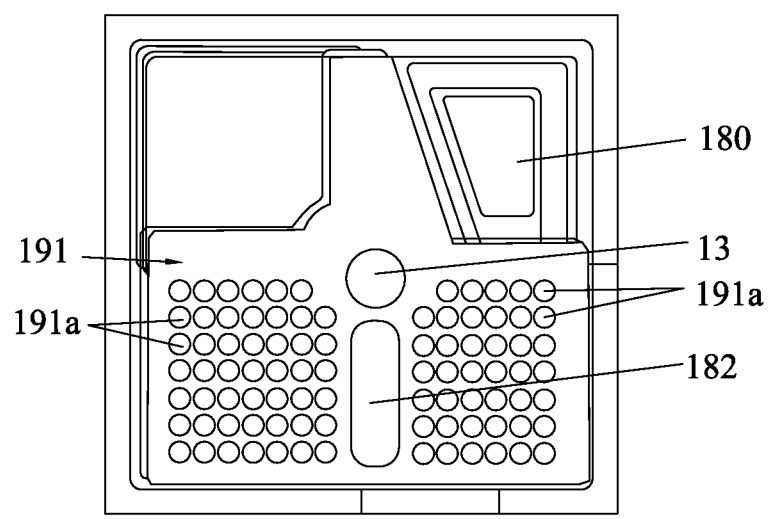
FIG. 4B shows a lower insulating member of the semiconductor light-emitting element of FIG. 4A.

FIG. 4A shows a modification of the semiconductor light-emitting element based on that shown in FIG. 1A, and FIG. 4B shows the insulating member of FIG. 4A.

The basic structure of semiconductor light-emitting element in this embodiment is similar to that of the above embodiment, except for a minor change on the insulating member. It's noticed that, the similar portions will not be described in detailed, which can be reviewed in the first embodiment mentioned above.

As shown in FIG. 4A, a first gap 181 is formed on the upper insulating member 192, which is between the first electrode 108 and the second electrode 109. Preferably, a second gap 182 is formed on the lower insulating member 191, as shown in FIG. 4B. Concretely, this first gap 181 may has a predetermined depth, for example, the first gap 181 is connected with the second gap 182. The configuration of gap between the two electrodes 108, 109 may improve the electrical performance of the light-emitting element.

Hereinafter, a manufacturing method of the semiconductor light-emitting element with the structure shown above will be described with reference to FIGS. 5 to 9. The components of FIGS. 4-8 that are the same as those shown in FIGS. 1, 2 retain the same reference numerals.

Figure 5A:
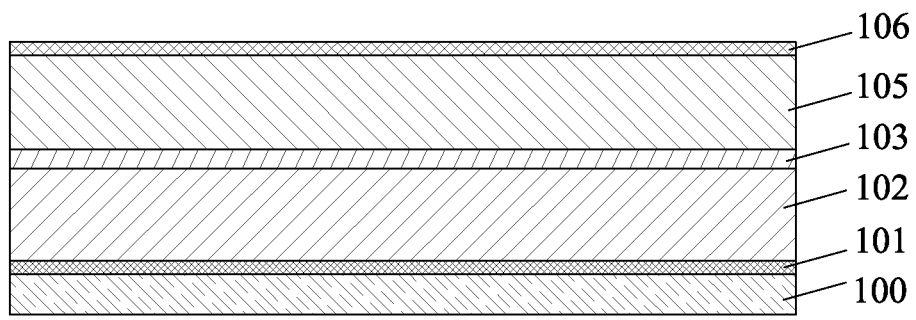
FIG. 5A-5C are cross-sectional views showing a method for manufacturing semiconductor light-emitting element according to an embodiment of the present invention in the order of its manufacturing process steps.

Referring to FIG. 5A, on the principal surface of the substrate 100 made of un-doped GaAs, the lower n-type contact layer 101, the n-type lower reflecting mirror film 102, the active layer 103, the p-type upper reflecting mirror film 105, the p-type upper contact layer 106 are sequentially formed by epitaxial crystal growth using an MOVPE (Metal-Organic Vapor Phase Epitaxy) method or the like.

Figure 5B:
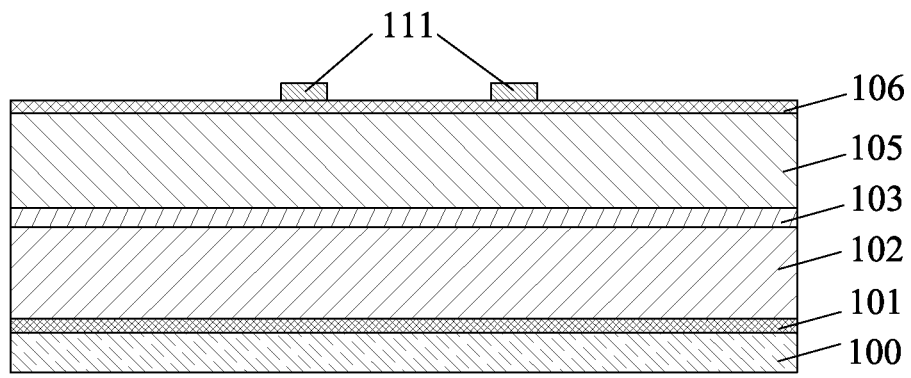
Figure 5C:
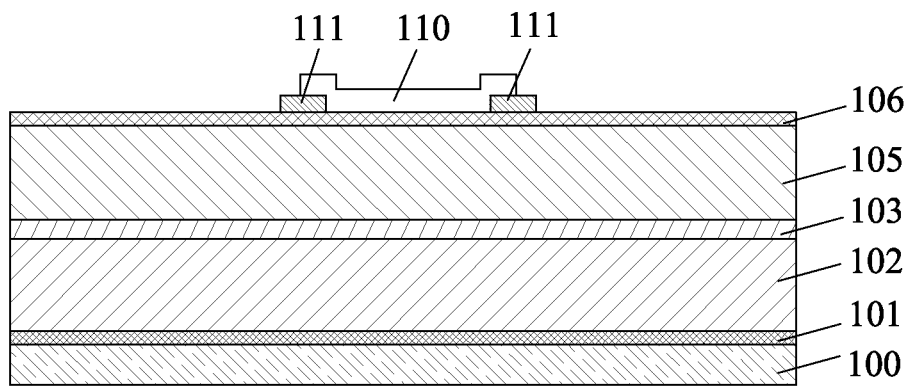

Next, two contact metal pads 111 separated in a predetermined distance are deposited on the p-type upper contact layer 106 by a thermal evaporation or sputtering method, as shown in FIG. 5B. Subsequently, a dielectric protection layer 110 is deposited on the contact metal pads 111 by PECVD (plasma enhanced chemical vapor deposition) and covered the portion of the upper contact layer 106 that is between the two contact metal pads 111, as shown in FIG. 5C.

Figure 6A:
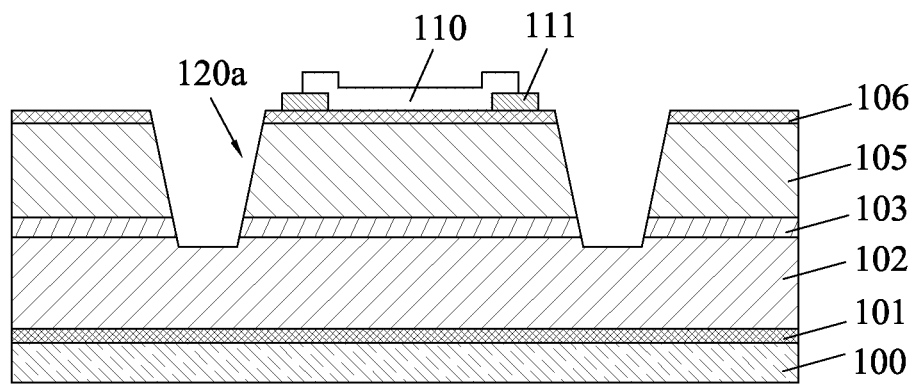
FIG. 6A-6D are cross-sectional views showing a method for manufacturing semiconductor light-emitting element according to an embodiment of the present invention in the order of its manufacturing process steps.

Subsequently, as shown in FIG. 6A, using a mask pattern (not shown) as an etching mask, the lower reflecting mirror film 102, the active layer 103, the current confinement layer 104, the upper reflecting mirror film 105, and the upper contact layer 106 are etched by reactive ion etching (RIE) method. Thus an upper portion 120a of the double-mesa structure 120 is formed. An object of the forming step of the upper portion 120a of the double-mesa structure 120 is to expose the active layer 103 and a small part of the lower reflecting mirror film 102 from the side surface of the upper portion 120a of the double-mesa structure 120.

Figure 6B:
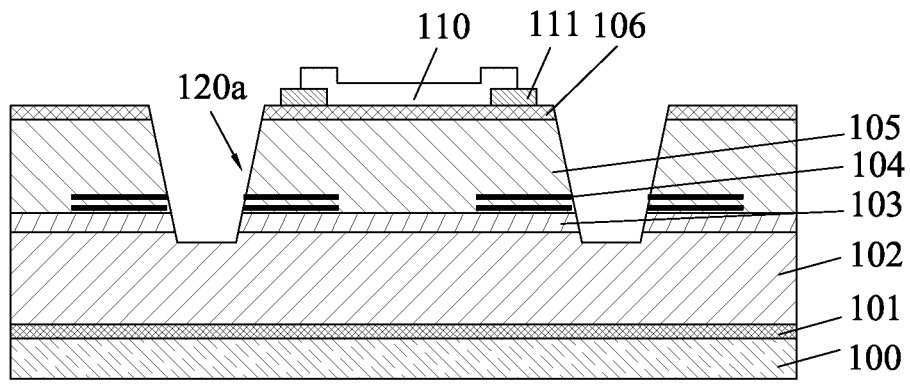
Figure 6C:
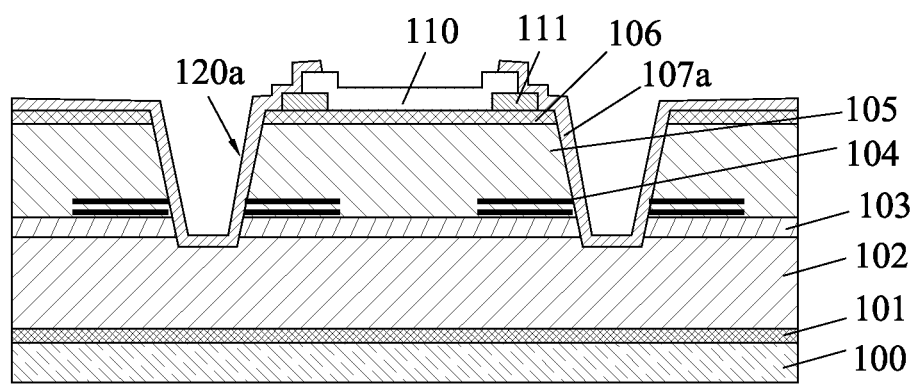

Next, by wet thermal oxidation forming the current confinement (oxidation aperture) layer 104 in the upper reflecting mirror 105 as shown in FIG. 6B. And then, a passivation layer 107 a is formed to cover the side surface of the upper portion 120a of the double-mesa structure 120 and the perimeter of the protection layer 110, as shown in FIG. 6C.

Figure 6D:
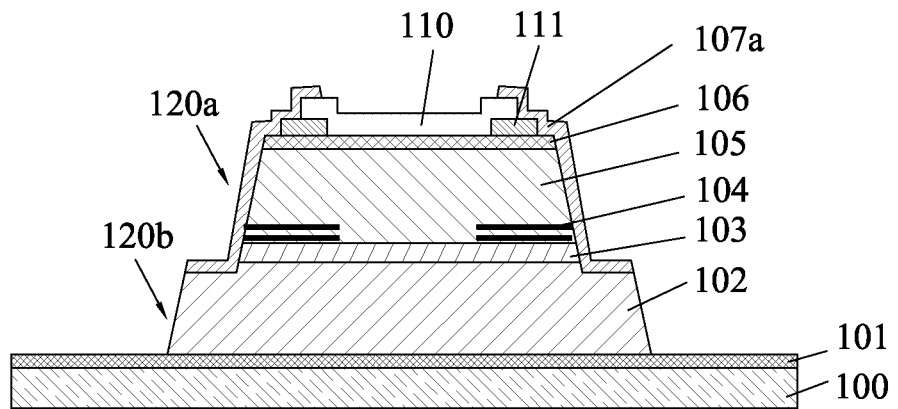

Next, as shown in FIG. 6D, a second etching step is performed to totally expose the lower reflecting mirror film 102 from the side surface to form the lower portion 120b of the double-mesa structure 120. An object in this step is to expose the top of lower contact layer 101 as well.

Figure 7A:
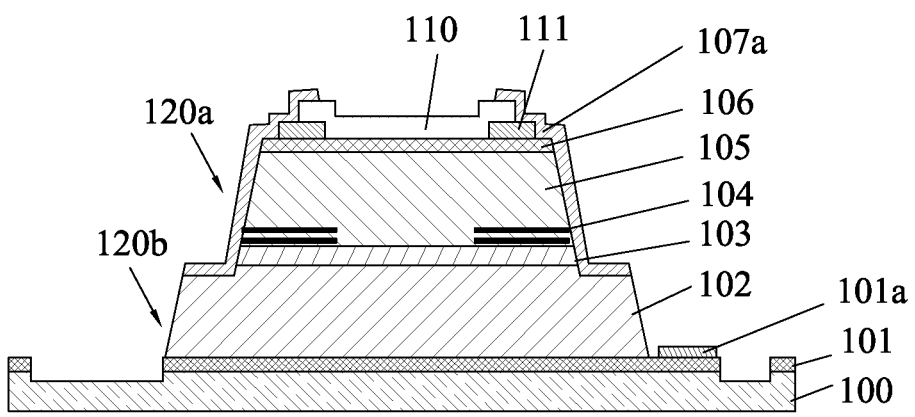
FIG. 7A-7B are cross-sectional views showing a method for manufacturing semiconductor light-emitting element according to an embodiment of the present invention in the order of its manufacturing process steps.

Subsequently, as shown in FIG. 7A, a third etching step is performed to isolate an individual element by etching the lower reflecting mirror film 102. Additionally, the conductive layer 101a may be formed on the lower contact layer 101, at the outer side of the double-mesa structure 120.

Figure 7B:
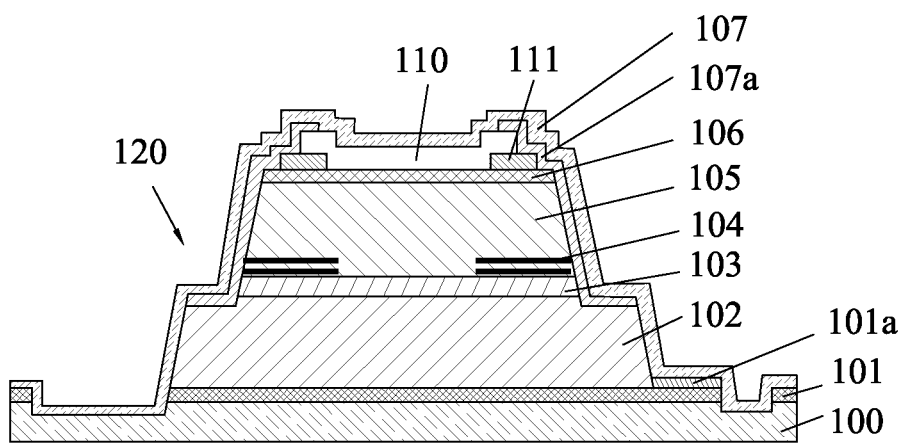

As shown in FIG. 7B, the insulator 107 of silicon oxynitride is formed by PECVD deposition, to cover the outer surfaces of the double-mesa structure 120, a side surface of the lower contact layer 106, and a portion of the substrate 100 exposed beside the double-mesa structure 120.

Figure 8A:
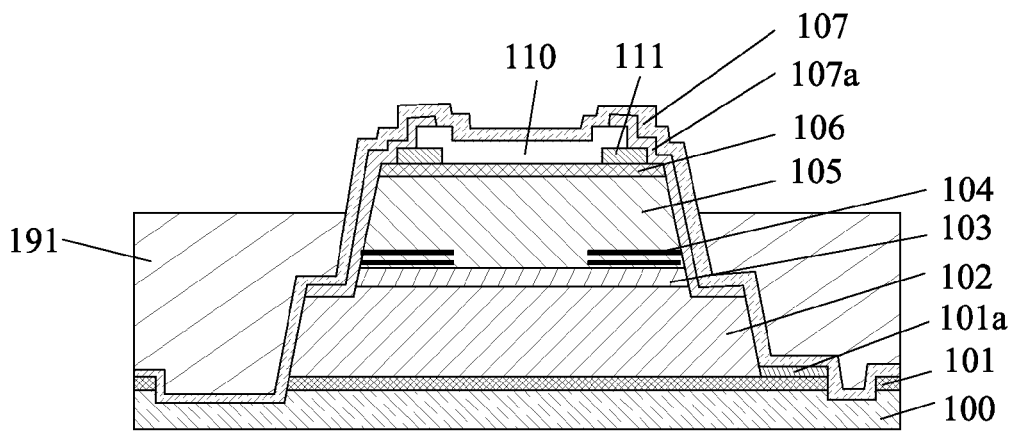
FIG. 8A-8C are cross-sectional views showing a method for manufacturing semiconductor light-emitting element according to an embodiment of the present invention in the order of its manufacturing process steps.
Figure 8B:
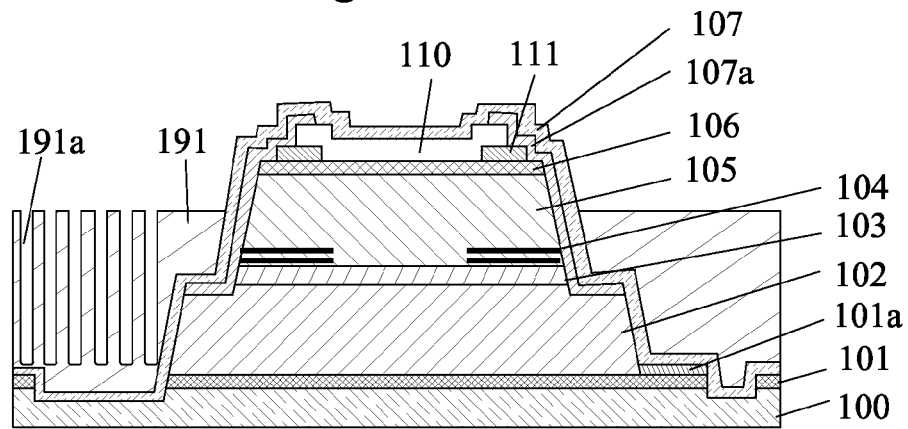
Figure 8C:
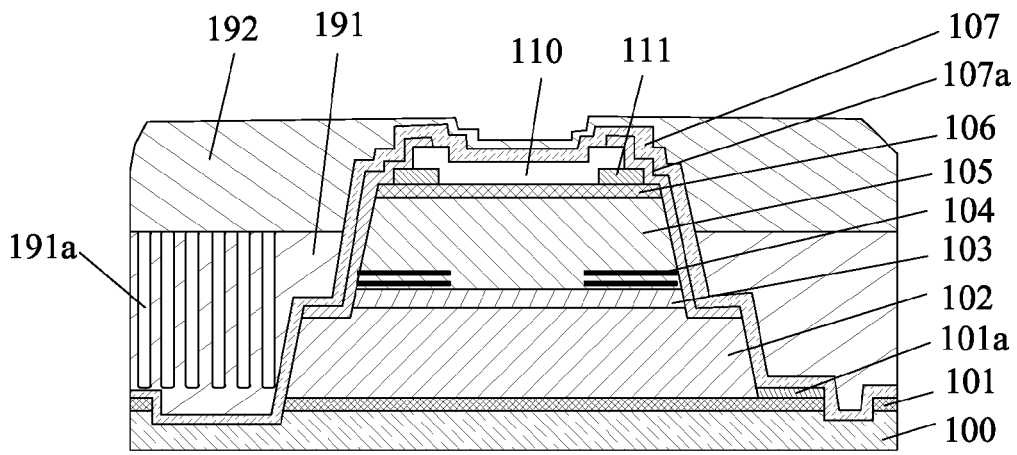

FIGS. 8A-8C shows the forming process of the insulating member 190. Firstly, the lower insluting member 191 made of BCB is formed on the side surface of the double-mesa structure 120 and its surrounding portion, with a thickness of 4~7 µm. Then, the applied lower insulating member 191 is kept in a nitrogen atmosphere at about 250° C., for about 60 minutes, thereby curing the lower insulating member 191. Next, as shown in FIG. 8B, the lower air pillars 191a are formed in the lower insulating member 191 at positions aligning with the first and second electrodes 108, 109, by RIE method for example, from top to bottom. Subsequently, as shown in FIG. 8C, on the lower insluting member 191 having the lower air pillars 191a, the upper insulating member 192 is formed to make the level of the insulating member 190 slightly higher than that of the top surface of the double-mesa structure 120. Then the upper air pillars 192a are formed around a position where the first electrode 108 is to be formed.

Figure 9A:
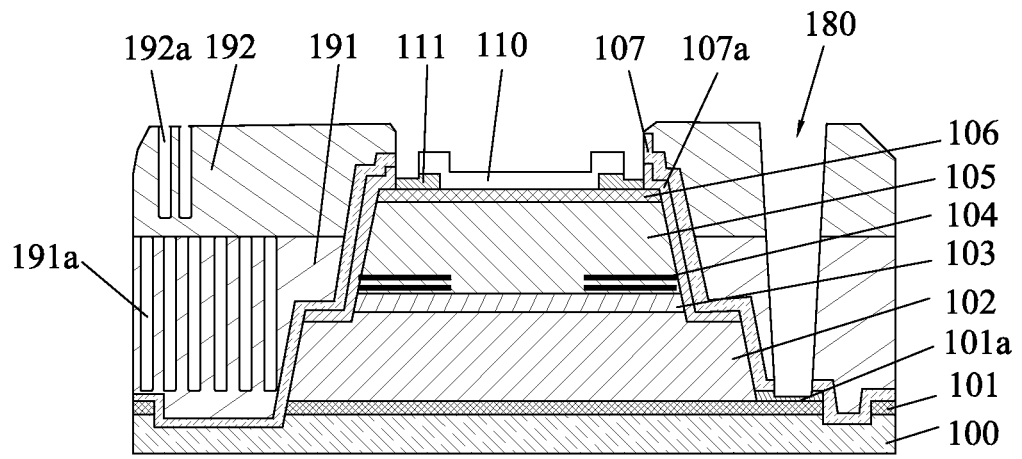
FIG. 9A-9B are cross-sectional views showing a method for manufacturing semiconductor light-emitting element according to an embodiment of the present invention in the order of its manufacturing process steps.
Figure 9B:
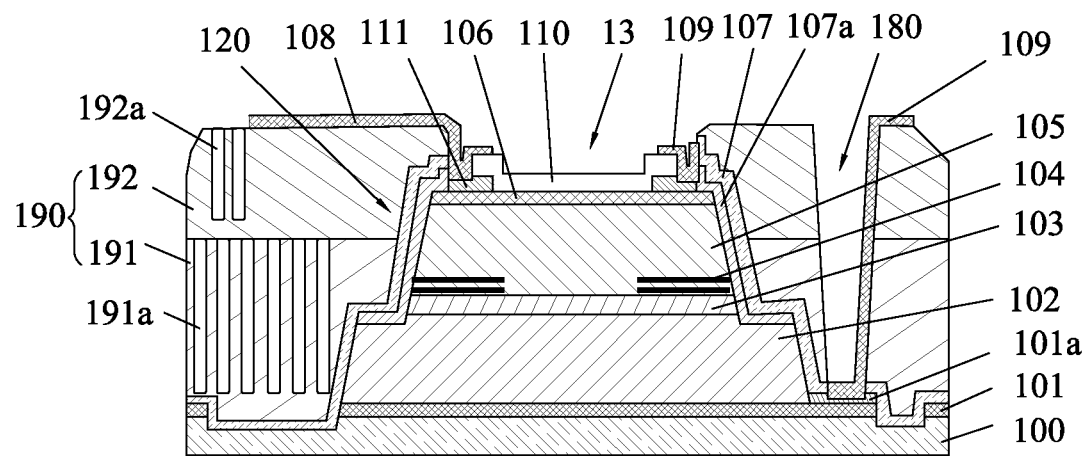

As shown in FIG. 9A, a portion of the upper insluting member 192 that is on the top surface of the double-mesa structure 120 is etched, to expose the protection layer 110 and a perimeter of the contact metal pad 111. And the deep groove 180 is formed in a side of the insulating member 190 from top to bottom, to expose the lower contact layer 101 (or a conductive layer 101' on the lower contact layer 101). Next, on top of the upper insulating member 192, the first electrode 108 is formed to come into contact with the upper contact layer 106 via the contact metal pad 111 and the perimeter of the insulator 107, and the second electrode 109 is formed to come into contact with the lower contact layer 101 and the upper contact layer 106, as shown in FIG. 9B. Thus the first and second electrodes 108, 109 are formed which has the electrode opening for emitting laser light, on top of the double-mesa structure 120.

With the manufacturing method described above, the semiconductor light-emitting element according to the first embodiment can be provided.

Preferably, the manufacturing method may include forming the gap on the upper insulating member 192, and/or on the lower insulting member 191, with the gap being between the first and second electrodes 108, 109.

In the manufacturing method, material of the lower and upper insulating member 191, 192 is optional as mentioned in the structure embodiment. And size, fill factor, amount of the air pillars 191a and 192a also are controllable, according to the actual demand.

In comparison with the prior art, as the semiconductor light-emitting element of the present invention configures the lower air pillars 191a and the upper air pillars 192a in the lower and upper insulating members 191, 192 respectively, thus the dielectric constant of the insulating member 190 is reduced effectively due to the small fill factor of insulating material (large fill factor of air pillar) therein, and the electrical parasitic capacitance is decreased accordingly, which improves high frequency performance and modulation speed of optoelectronic devices finally. In addition, the dielectric constant of the insulating member can be tunable and controllable by optimizing the fill factor of air pillars by changing size, shape, amount thereof for example.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A semiconductor light-emitting element comprising:
a double-mesa structure of semiconductor formed to have a cylindrical cross section, the double-mesa structure including an upper mesa structure and a lower mesa structure, the upper mesa structure being stacked on top of the lower mesa structure such that a portion of a lower reflecting mirror film at the top of the lower mesa structure is not covered by the upper mesa structure;
an insulating member formed to fill a space surrounding the double-mesa structure, with the insulating member comprising a lower insulating member and an upper insulting member covering the lower insulating member; and
a first electrode formed on the upper insulating member to come into contact with part of a top surface of the double-mesa structure;
wherein the lower insulating member has multiple lower air pillars in the form of a matrix that are formed in an area in the lower insulating member directly underneath the first electrode and in an area in the lower insulating member not directly underneath the first electrode in a layout view, and the upper insulating member has multiple upper air pillars in areas surrounding the first electrode, without having any air pillar in areas of the upper insulating member that are directly underneath the first electrode in the layout view.

2. The semiconductor light-emitting element according to claim 1, wherein the lower air pillars in the lower insulating member are not connected with the upper air pillars in the upper insulating member.

3. The semiconductor light-emitting element according to claim 1, further comprising a second electrode formed on the upper insulating member, wherein a gap is formed on the upper insulating member, and/or formed on the lower insulting member, which is between the first electrode and the second electrode.

4. The semiconductor light-emitting element according to claim 1, wherein the lower insulating member is made of benzocyclobutene resin, polyimide resin, AL polymer, SU8 photoresist, or other coating resins or polymers with a lower dielectric constant value.

5. The semiconductor light-emitting element according to claim 1, wherein the upper insulating member is made of benzocyclobutene resin, polyimide resin, AL polymer, SU8 photoresist, thick layers of silicon oxide, silicon nitride, silicon oxynitride, niobium oxide, zirconium oxide, tantalum oxide, or other coating resins or polymers with a lower dielectric constant value.

6. The semiconductor light-emitting element according to claim 3, wherein the lower air pillars are formed in areas that are aligned with both of the first electrode and the second electrode.

* * * * *